United States Patent
Yamada et al.

(10) Patent No.: US 9,142,988 B2
(45) Date of Patent: Sep. 22, 2015

(54) WORKPIECE DETECTION MECHANISM

(71) Applicants: Takaya Yamada, Osaka (JP); Katsuyuki Morita, Osaka (JP); Haruo Maetani, Osaka (JP)

(72) Inventors: Takaya Yamada, Osaka (JP); Katsuyuki Morita, Osaka (JP); Haruo Maetani, Osaka (JP)

(73) Assignee: DAIHEN CORPORATION (JP)

( * ) Notice: Subject to any disclaimer, the term of this patent is extended or adjusted under 35 U.S.C. 154(b) by 457 days.

(21) Appl. No.: 13/708,268

(22) Filed: Dec. 7, 2012

(65) Prior Publication Data

US 2013/0147437 A1  Jun. 13, 2013

(30) Foreign Application Priority Data

Dec. 8, 2011  (JP) ................................. 2011-269329

(51) Int. Cl.
| | |
|---|---|
| *H01M 10/46* | (2006.01) |
| *H02J 7/00* | (2006.01) |
| *H01L 21/67* | (2006.01) |
| *H01L 21/677* | (2006.01) |

(52) U.S. Cl.
CPC ......... *H02J 7/0068* (2013.01); *H01L 21/67259* (2013.01); *H01L 21/67742* (2013.01); *H02J 7/0063* (2013.01)

(58) Field of Classification Search
CPC .................................. H02J 5/005; H02J 7/025
USPC .................... 320/108, 128; 414/226.05, 627; 198/689.1
See application file for complete search history.

(56) References Cited

U.S. PATENT DOCUMENTS

| | | | |
|---|---|---|---|
| 2006/0181242 A1* | 8/2006 | Freed et al. ................... | 320/109 |
| 2008/0013958 A1 | 1/2008 | Katsuki et al. | |
| 2013/0000254 A1* | 1/2013 | Rebstock ........................ | 53/432 |
| 2013/0004268 A1* | 1/2013 | Rebstock ...................... | 320/137 |

FOREIGN PATENT DOCUMENTS

| | | | |
|---|---|---|---|
| JP | 2002141395 A | 5/2002 | |
| JP | 2005-158827 A | 6/2005 | |
| JP | 2007-227781 A | 9/2007 | |
| JP | 2007274091 A | 10/2007 | |
| JP | 2008074551 A | 4/2008 | |
| JP | 2010050497 A | 3/2010 | |

OTHER PUBLICATIONS

Japanese Notice of Reasons for Refusal corresponding to Patent Application No. 2011-269329; Shipping Date: Aug. 4, 2015, with English translation.

* cited by examiner

*Primary Examiner* — Edward Tso
(74) *Attorney, Agent, or Firm* — Cantor Colburn LLP

(57) ABSTRACT

A workpiece detection mechanism may include a sensor part detecting the workpiece; a sensor amplifier part connected to the sensor part and processing a signal from the sensor part; a battery part supplying electric power to the sensor amplifier part; and a wireless transmitting part transmitting by wireless the signal from the sensor amplifier part to an outside of the vacuum chamber. The sensor part, the sensor amplifier part, the battery part and the wireless transmitting part may be provided in one end effector provided in the workpiece transfer mechanism and are not connected directly to any member other than the end effector.

4 Claims, 10 Drawing Sheets

Fig. 2
(a)
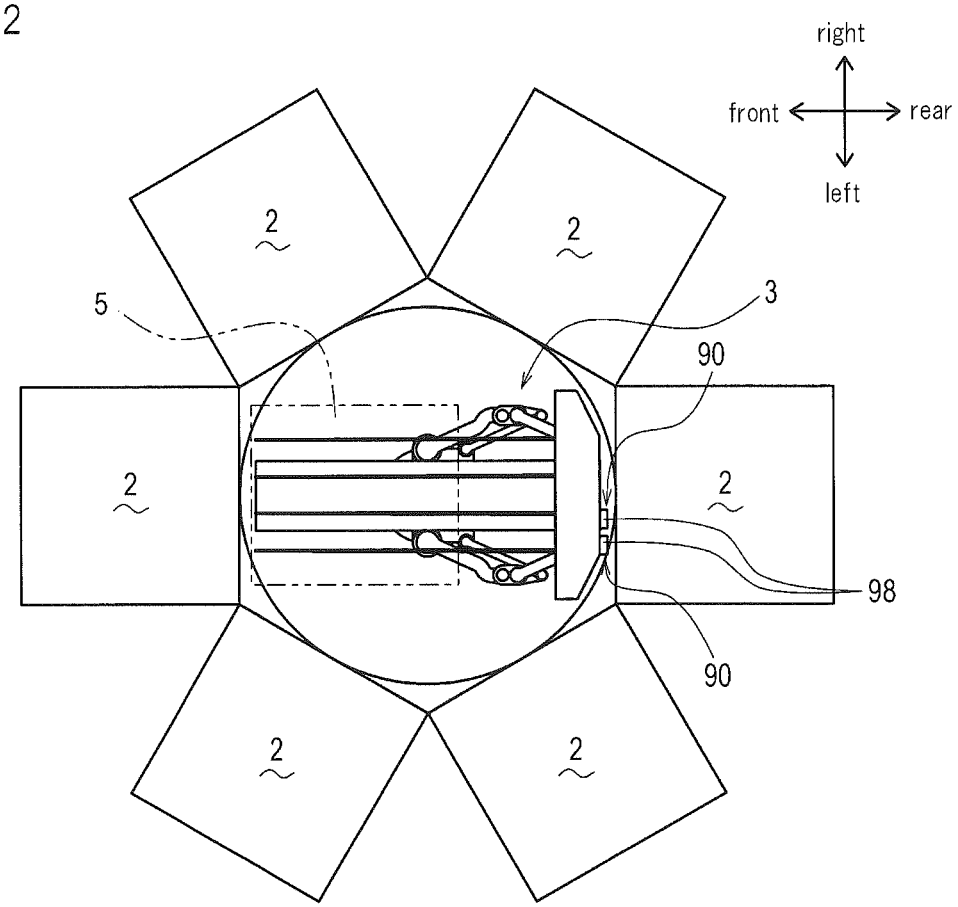
(b)
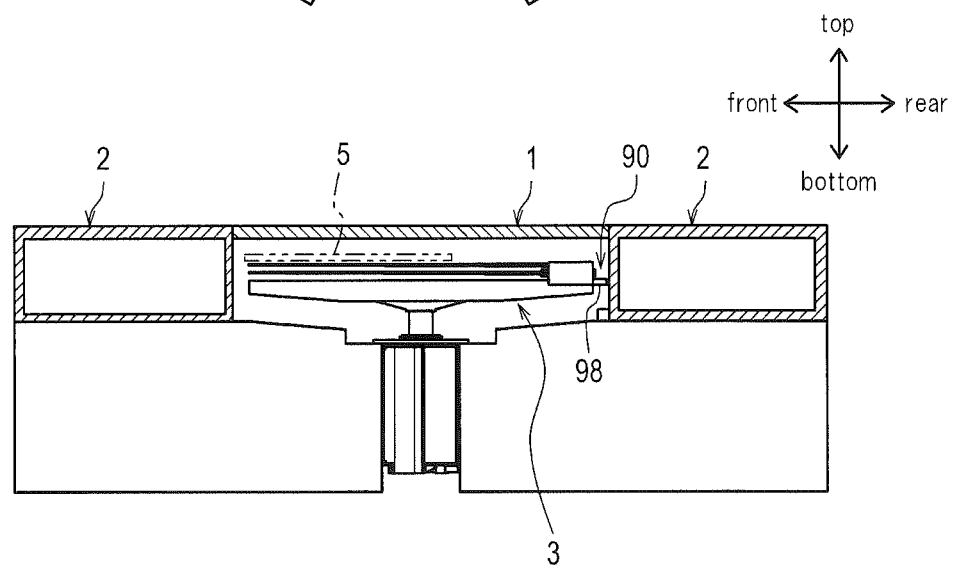

Fig. 5
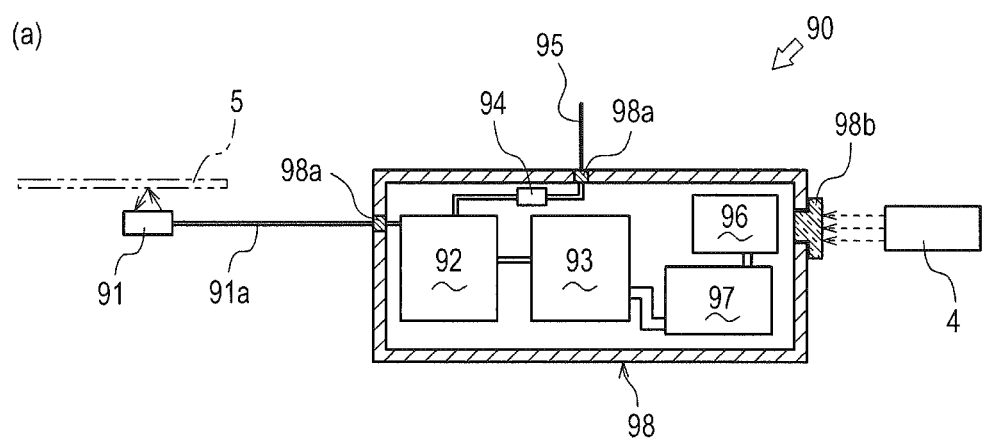
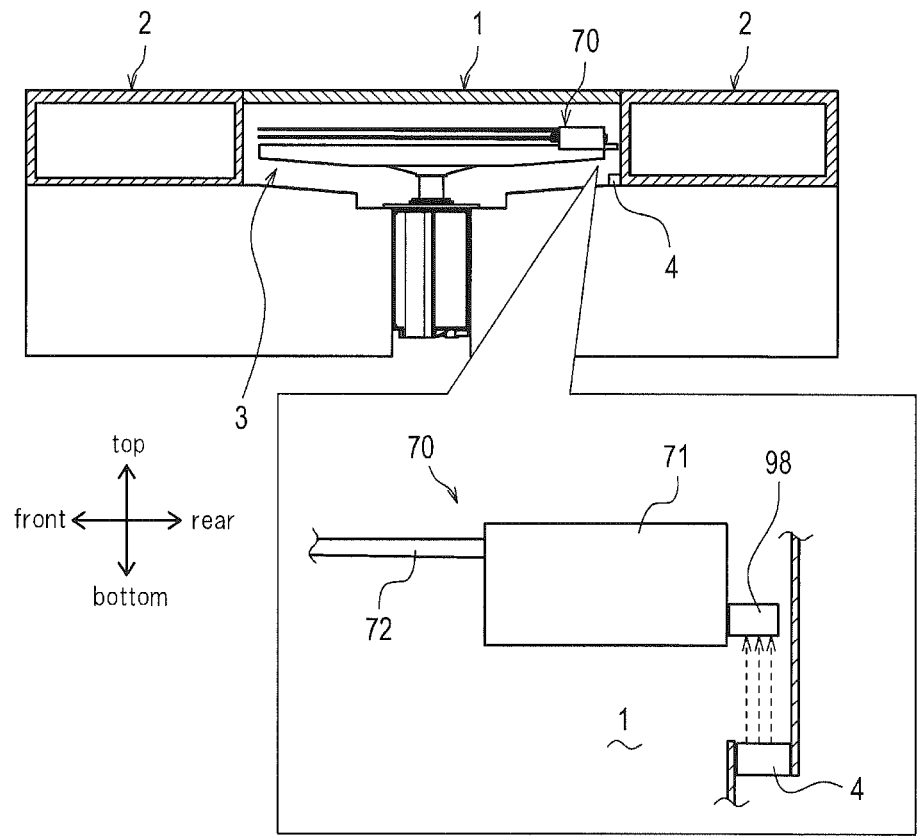

Fig. 6
(a)
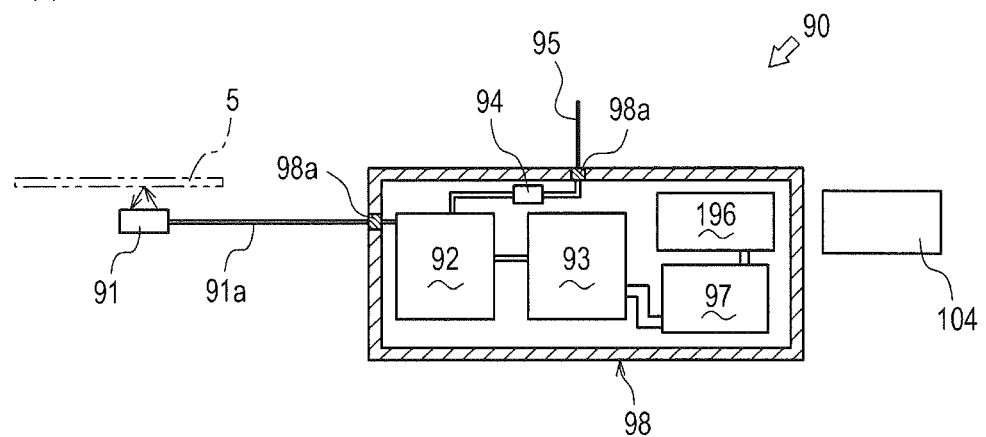
(b)
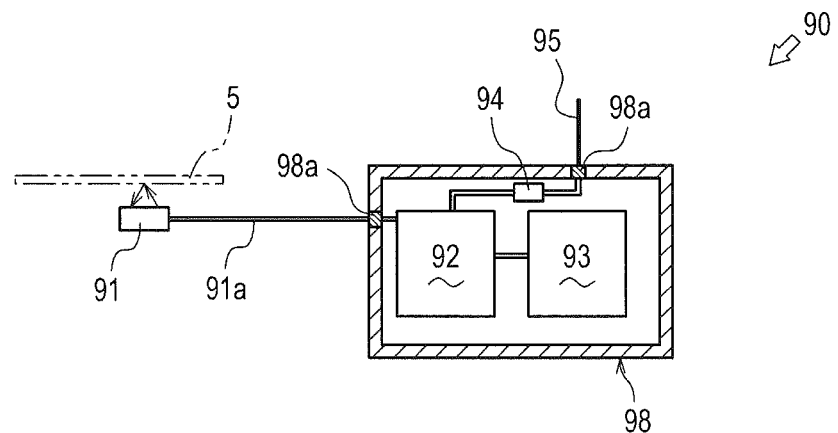

Fig. 7
(a)
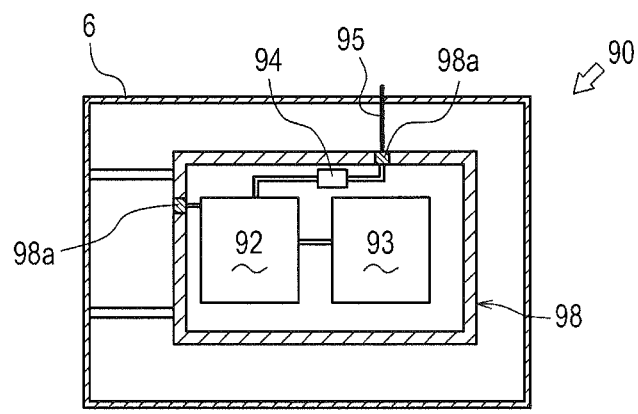
(b)
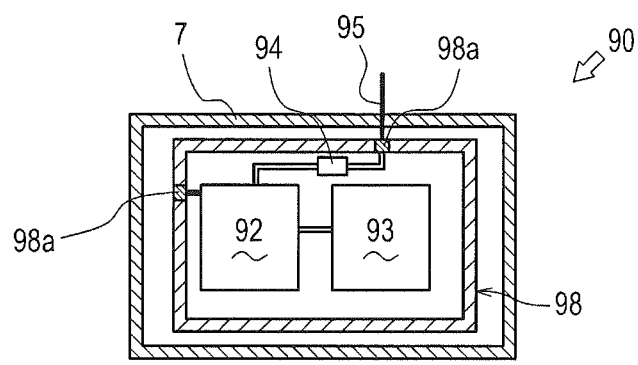
(c)
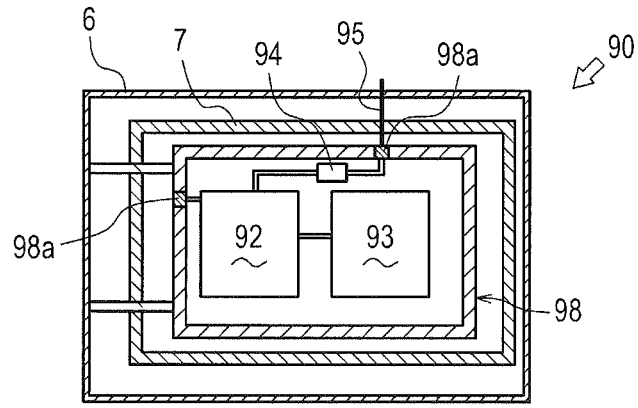

Fig. 9
(a)
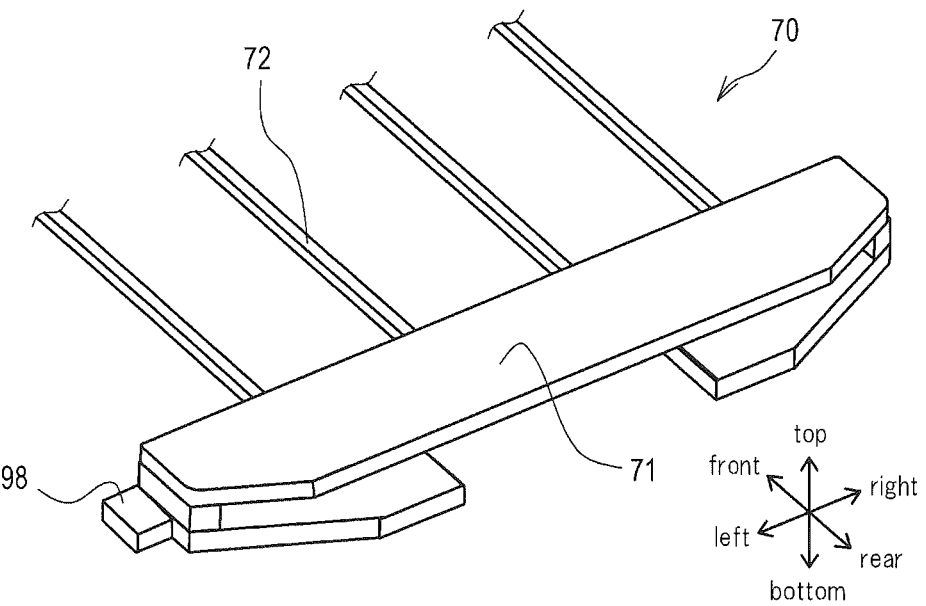
(b)
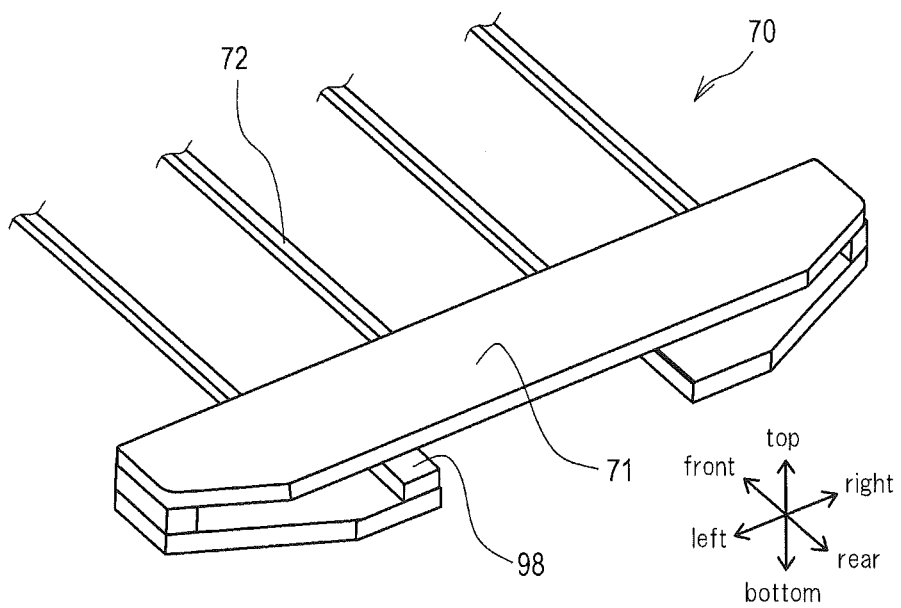

WORKPIECE DETECTION MECHANISM

TECHNICAL FIELD

The present invention relates to a workpiece detection mechanism detecting a workpiece conveyed by a workpiece transfer mechanism in a vacuum chamber.

BACKGROUND ART

Conventionally, an art of a workpiece detection mechanism detecting a workpiece conveyed by a workpiece transfer mechanism in a vacuum chamber is well known. Examples thereof are described in the Patent Literatures 1 and 2.

In the art described in the Patent Literature 1, a workpiece detection mechanism (sensor or the like) detecting a workpiece is arranged outside a vacuum room (vacuum chamber), and the workpiece detection mechanism detects the workpiece (a silicon wafer, a glass substrate for a solar cell or the like) conveyed by a workpiece transfer mechanism in the vacuum room is detected. Accordingly, whether the workpiece is conveyed certainly or not can be confirmed.

However, in the art described in the Patent Literature 1, the workpiece detection mechanism (sensor or the like) is fixed to a position determined previously and can detect only that the workpiece reaches a predetermined position in a conveyance process. Accordingly, when the workpiece drops out at another position in the conveyance process, it is disadvantageous that the dropping out cannot be detected immediately.

In the art described in the Patent Literature 2, a workpiece detection mechanism is arranged in a workpiece transfer mechanism. In more detail, a sensor is arranged in an end effector (a part which moves while mounting a workpiece thereon so as to convey the workpiece) of the workpiece transfer mechanism, and a communication unit transmitting detection results of the sensor with the outside and a charging unit storing electric power to be supplied to the communication unit are arranged in a base part (a part not movable and in which the end effector is supported movably via an arm) of the workpiece transfer mechanism. Accordingly, by arranging the sensor in the end effector, the workpiece can be detected at any position in the conveyance process, and when the workpiece drops out, the dropping out can be detected immediately.

However, in the art described in the Patent Literature 2, wires connecting the sensor arranged in the end effector to the communication unit and the like arranged in the base part are arranged over the arm and the end effector. Accordingly, when the end effector moves, it is disadvantageous that the wires may be damaged in the connection part between the base part and the arm or the connection part between the arm and the end effector. Furthermore, it is disadvantageous that the action of the end effector must be restricted (for example, the range of action of each connection part is restricted) for preventing the damage of the wires.

PRIOR ART REFERENCE

Patent Literature

Patent Literature 1: the Japanese Patent Laid Open Gazette 2007-227781

Patent Literature 2: the Japanese Patent Laid Open Gazette 2005-158827

DISCLOSURE OF INVENTION

Problems to Be Solved by the Invention

The present invention is provided in consideration of the problems mentioned above, and the purpose of the present invention is to provide a workpiece detection mechanism in which wires of the workpiece detection mechanism are not damaged by movement of an end effector and the movement of the end effector is not restricted.

Means for Solving the Problems

The above-mentioned problems are solved by the present invention with the following means.

According to claim 1, a workpiece detecting a workpiece conveyed by a workpiece transfer mechanism in an inside of a vacuum chamber, includes a sensor part detecting the workpiece, a sensor amplifier part connected to the sensor part and processing a signal from the sensor part, a battery part supplying electric power to the sensor amplifier part, and a wireless transmitting part transmitting by wireless the signal from the sensor amplifier part to an outside of the vacuum chamber. The sensor part, the sensor amplifier part, the battery part and the wireless transmitting part are provided in one end effector provided in the workpiece transfer mechanism and are not connected directly to any member other than the end effector.

According to claim 2, a charging part converting energy supplied from the outside of the vacuum chamber with a contactless method into electric power and charges the battery part is provided, and the charging part is provided in the one end effector and not connected directly to any member other than the end effector and energy is supplied from the outside of the vacuum chamber to the charging part by the contactless method so that electric power is generated and used for charging.

According to claim 3, the parts other than the sensor part in the workpiece detection mechanism are covered by one housing, and the one housing is thermally insulated with an inner space of the vacuum chamber.

According to claim 4, the one housing is arranged in an basal end part of the end effector.

Effect of the Invention

The present invention constructed as the above brings the following effects.

According to claim 1, the workpiece detection mechanism is not provided over the end effector and another member, whereby the wire or the like of the workpiece detection mechanism is not damaged by the movement of the end effector, and the movement of the end effector is not restricted.

According to claim 2, the battery part can be charged without being connected directly to any apparatus outside the vacuum chamber.

According to claim 3, the temperature inside of the housing can be prevented from rising by radiant heat in the vacuum chamber, whereby failure of the parts can be prevented.

According to claim 4, the members constituting the workpiece detection mechanism (the members covered by the one housing) is arranged at a position at which the members touch hardly to the workpiece, whereby the members are prevented from being damaged.

BRIEF DESCRIPTION OF DRAWINGS

FIG. 2(a) is a plan view of the workpiece transfer mechanism and the load lock chamber. (b) is a schematic sectional side view of the workpiece transfer mechanism and the load lock chamber.

FIG. 5(a) is a schematic sectional side view of the workpiece detection mechanism. (b) is a schematic sectional side view of positional relation between a housing and a light source.

FIG. 6(a) is a schematic sectional side view of another embodiment of the workpiece detection mechanism. (b) is a schematic sectional side view of further another embodiment of the workpiece detection mechanism.

FIG. 7(a) is a schematic sectional side view of a situation in which a reflector is provided in the workpiece detection mechanism. (b) is a schematic sectional side view of a situation in which a heat insulating member is provided in the workpiece detection mechanism. (c) is a schematic sectional side view of a situation in which the reflector and the heat insulating member are provided in the workpiece detection mechanism.

FIG. 9(a) is a perspective view of a situation in which the housing is fixed to a side surface of a first end effector. (b) is a perspective view of a situation in which the housing is fixed to an inner surface of the first end effector.

DETAILED DESCRIPTION OF THE INVENTION

Figure 1:
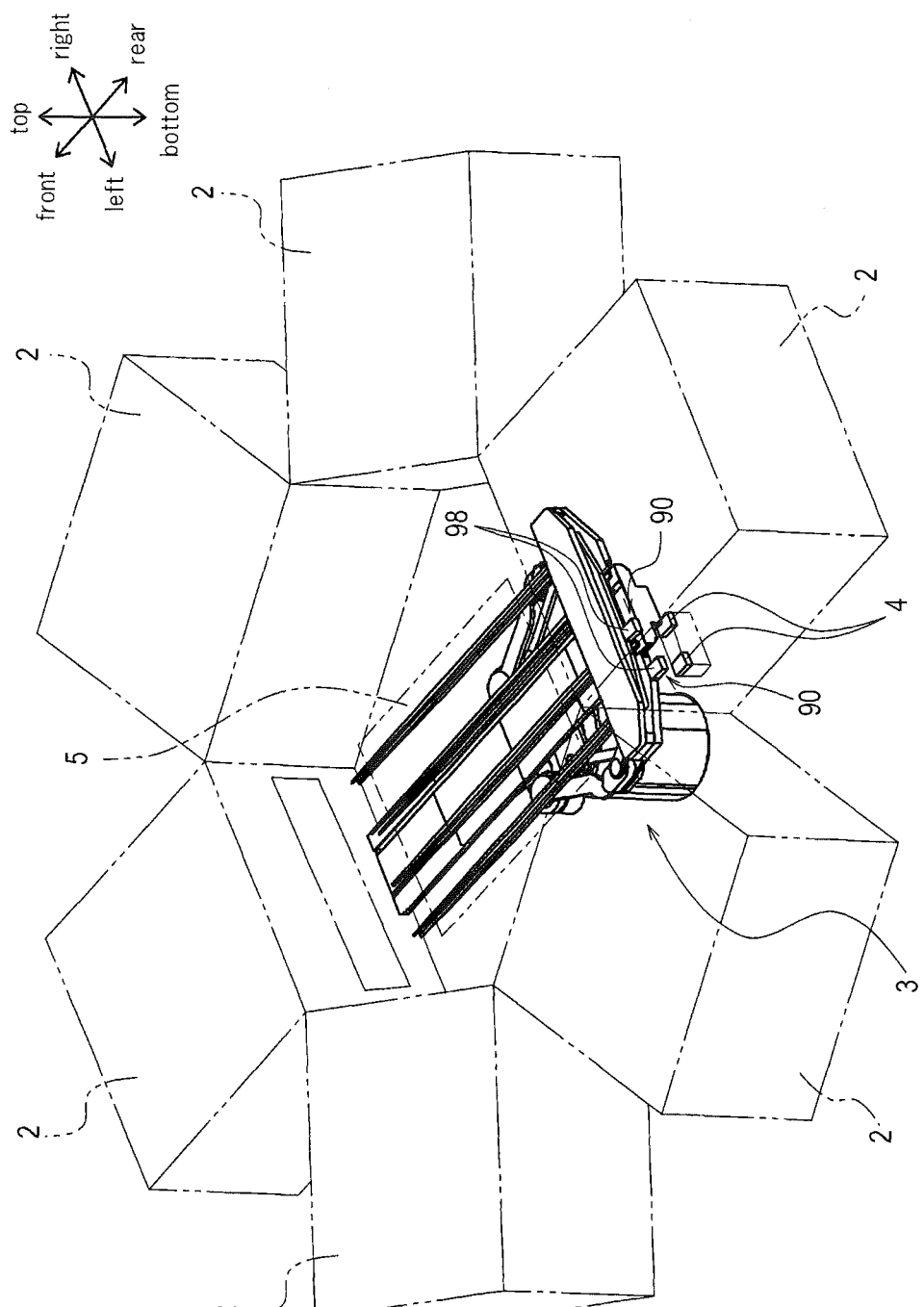
FIG. 1 A perspective view of workpiece transfer mechanism and a load lock chamber having workpiece detection mechanism according to an embodiment of the present invention.

In below explanation, longitudinal, lateral and vertical directions are defined according to arrows shown in the drawings.

Firstly, an explanation will be given on a workpiece transfer mechanism 3 having a workpiece detection mechanism 90 according to an embodiment of the present invention.

In the workpiece transfer mechanism 3 shown in FIGS. 1 and 2, a workpiece 5 (for example, a silicon wafer, a glass substrate for a solar cell or the like) is conveyed in a vacuum chamber 1. A plurality of load lock chambers 2 are arranged substantially on a circumference of a circle when viewed in plan, and the workpiece transfer mechanism 3 is arranged in the vacuum chamber 1 arranged at the center of the circle. In the workpiece transfer mechanism 3, based on a predetermined program, the workpiece 5 can be conveyed from one load lock chamber 2 to another load lock chamber 2.

Figure 3:
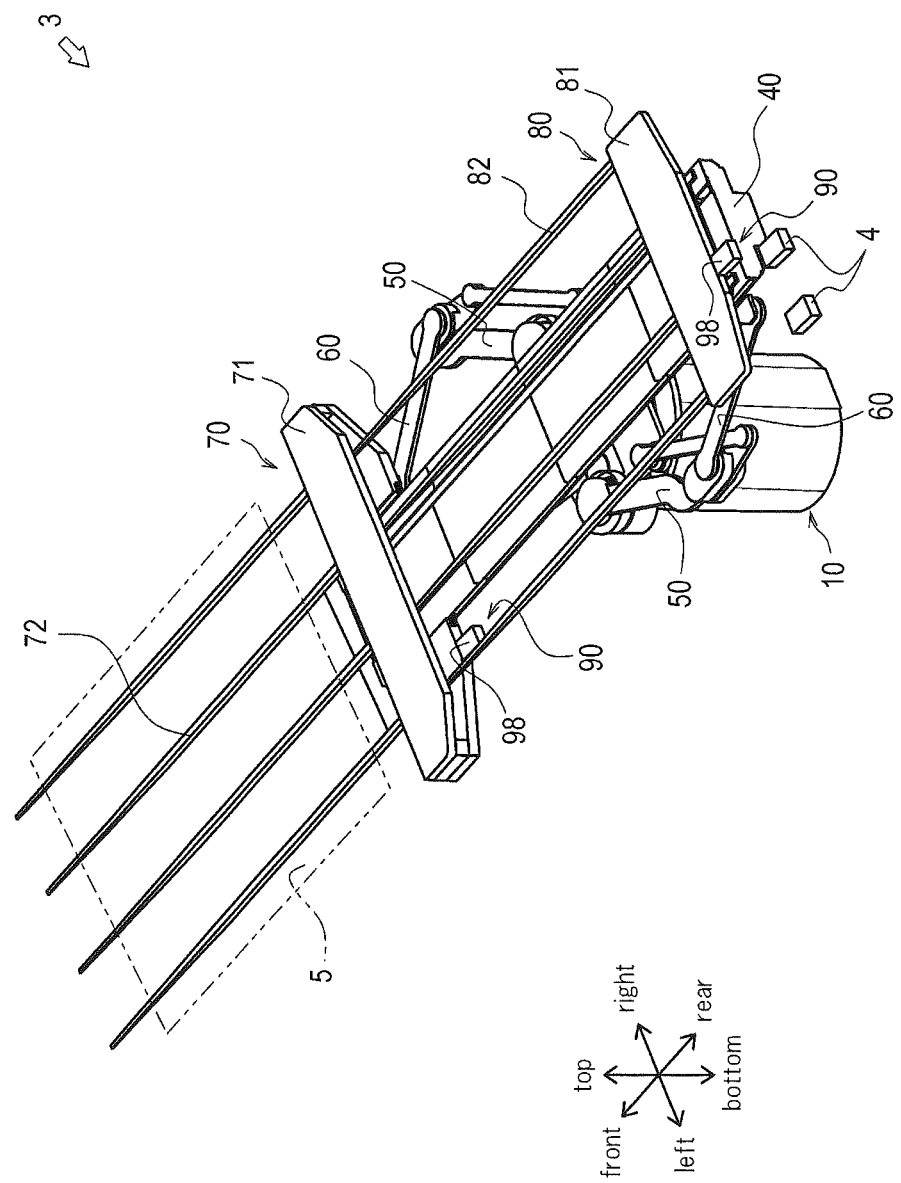
FIG. 3 A perspective view of the workpiece transfer mechanism.
Figure 4:
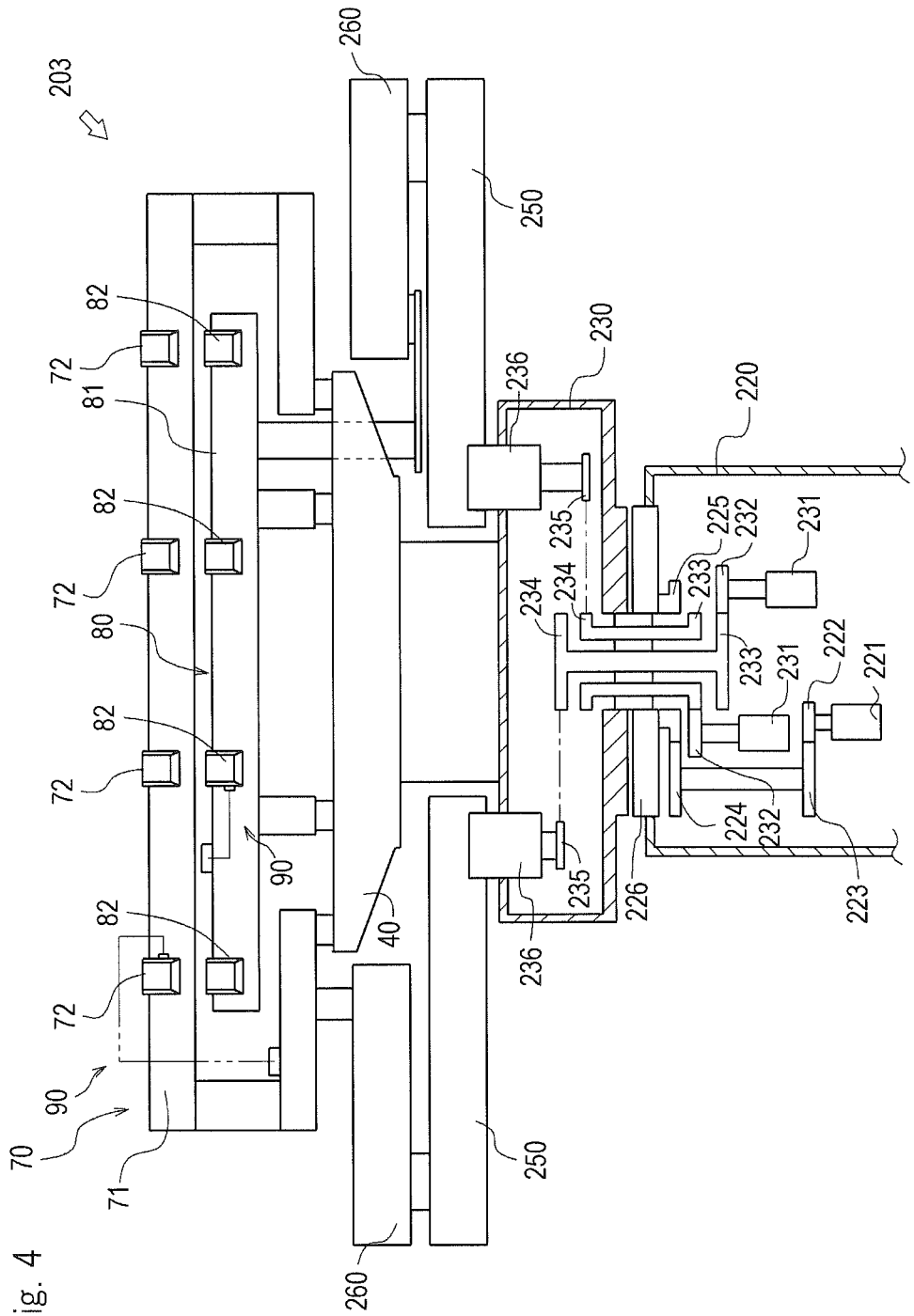
FIG. 4 A schematic sectional view of the workpiece transfer mechanism.

The workpiece transfer mechanism 3 shown in FIGS. 3 and 4 mainly has a holding part 10, an elevation shaft 20, a turning shaft 30, a guide part 40, two first link arm parts 50, two second link arm parts 60, a first end effector 70, a second end effector 80 and the workpiece detection mechanism 90.

The holding part 10 shown in FIG. 3 is a main structure of the workpiece transfer mechanism 3. The holding part 10 is formed so as to be a substantially hollow cylinder whose axis is along the vertical direction. A vertical moving mechanism (not shown in drawings) is arranged inside the holding part 10 so as to move the later-discussed elevation shaft 20 vertically.

The elevation shaft 20 shown in FIG. 4 is inserted into the holding part 10 so as to be slidable vertically relatively to the holding part 10. The elevation shaft 20 is driven vertically by the vertical moving mechanism. Inside the elevation shaft 20, a turning motor 21 and a turning reduction gear 22 are arranged so as to make the later-discussed turning shaft 30 turn.

The turning shaft 30 is inserted into the elevation shaft 20 so as to be rotatable (turnable) relatively to the elevation shaft 20. The turning shaft 30 is rotatively driven by driving power of the turning motor 21 transmitted via the turning reduction gear 22. Inside the turning shaft 30, two sliding motors 31 and two sliding reduction gears 32 are arranged so as to make the later-discussed first end effector 70 and second end effector 80 slide.

The guide part 40 shown in FIG. 3 guides the later-discussed first end effector 70 and second end effector 80. The guide part 40 is supported by an upper end of the turning shaft 30. The lengthwise direction of the guide part 40 is arranged along the longitudinal direction. A rail is formed in the guide part 40 along the lengthwise direction thereof so as to guide the first end effector 70 and the second end effector 80.

The first link arm parts 50 shown in FIGS. 3 and 4 transmit the driving power from the sliding motors 31 to the first end effector 70 and the second end effector 80. One of ends of each of the first link arm parts 50 is rotatably connected to the turning shaft 30 and is connected to corresponding one of the sliding motors 31 via corresponding one of the sliding reduction gears 32.

The second link arm parts 60 transmit the driving power from the sliding motors 31 to the first end effector 70 and the second end effector 80. One of ends of each of the second link arm parts 60 is rotatably connected to the other end of corresponding one of the first link arm parts 50.

The first end effector 70 conveys the workpiece 5 by mounting the workpiece 5 thereon or another method. The first end effector 70 mainly has a basal end part 71 and a mounting part 72.

The basal end part 71 is constructed by a plurality of plate members and the like and arranged so that the lengthwise direction thereof is along the lateral direction. The basal end part 71 is rotatably connected to the other end of one of the second link arm parts 60, and is supported by the guide part 40 so as to be able to slide along the rail of the guide part 40.

The mounting part 72 is constructed by four long and slender cylindrical members, and is extendingly provided forward from the front end of the basal end part 71 while the lengthwise direction of the mounting part 72 is arranged along the longitudinal direction.

The second end effector 80 conveys the workpiece 5 by mounting the workpiece 5 thereon or another method. The second end effector 80 mainly has a basal end part 81 and a mounting part 82.

The basal end part 81 is constructed by a plate member and the like and arranged so that the lengthwise direction thereof is along the lateral direction. The basal end part 81 is rotatably connected to the other end of the other second link arm parts 60, and is supported by the guide part 40 so as to be able to slide along the rail of the guide part 40.

The mounting part 82 is constructed by four slender rod-like members, and is extendingly provided forward from the front end of the basal end part 81 while the lengthwise direction of the mounting part 82 is arranged along the longitudinal direction.

The turning shaft 30 and the second link arm parts 60, and the first link arm parts 50 and the first end effector 70 and the second end effector 80 are connected respectively via pulleys and belts. When the first link arm parts 50 are rotated by the driving power of the sliding motors 31, the second link arm parts 60, the first end effector 70 and the second end effector 80 are rotated.

The workpiece detection mechanism 90 detects the workpiece 5 mounted on the first end effector 70 and the second end effector 80. The detailed construction of the workpiece detection mechanism 90 will be discussed later.

Next, an explanation will be given on the operation mode of the workpiece transfer mechanism 3 constructed as mentioned above.

When the workpiece transfer mechanism 3 does not convey the workpiece 5, the workpiece transfer mechanism 3 is at work origin posture (see FIGS. 1 and 2). The work origin posture of the workpiece transfer mechanism 3 is the state at which the elevation shaft 20 is slid to the lowest position, the lengthwise direction of each of the first end effector 70 and the second end effector 80 is along the longitudinal direction (in more detail, the basal end parts 71 and 81 are arranged at the rear side and the mounting parts 72 and 82 are arranged at the front side), and each of the first end effector 70 and the second end effector 80 is slid to the most rear position.

When the workpiece transfer mechanism 3 conveys the workpiece 5, vertical moving mechanism (not shown in drawings), the turning motor 21 and the sliding motors 31 are driven so as to move the first end effector 70 and the second end effector 80 vertically suitably, whereby the mounting parts 72 and 82 can be slid suitably while being directed to suitable directions. By repeating this operation, the workpiece 5 in the load lock chamber 2 can be mounted on the mounting parts 72 and 82 and conveyed to another load lock chamber 2.

Next, an explanation will be given on the construction of the workpiece detection mechanism 90.

The workpiece detection mechanism 90 is provided in each of the first end effector 70 and the second end effector 80. However, the construction of the two workpiece detection mechanism 90 is substantially the same, and only the workpiece detection mechanism 90 provided in the first end effector 70 will be described below.

The workpiece detection mechanism 90 shown in FIG. 5 detects the workpiece 5 mounted on the first end effector 70. The workpiece detection mechanism 90 mainly has a sensor part 91, a sensor amplifier part 92, a battery part 93, a wireless transmitting part 94, an antenna 95, a solar panel 96, a battery charger 97 and a housing 98.

The sensor part 91 shown in FIGS. 4 and 5(*a*) has a floodlighting part and a light receiving part, and light irradiated from the floodlighting part and reflected by the workpiece 5 is received by the light receiving part so as to detect the workpiece 5. The sensor part 91 is arranged in the mounting part 72 of the first end effector 70 (see FIG. 4).

The sensor amplifier part 92 shown in FIG. 5(*a*) is connected to the sensor part 91 and performs procession such as amplification of a signal from the sensor part 91. The sensor amplifier part 92 is connected to the sensor part 91 via a wire 91*a* constructed by an optical fiber or the like. The wire 91*a* is provided along the basal end part 71 and the mounting part 72 of the first end effector 70 (or inside the basal end part 71 and the mounting part 72).

The battery part 93 supplies power to the sensor amplifier part 92. The battery part 93 is connected to the sensor amplifier part 92.

The wireless transmitting part 94 transmits a signal from the sensor amplifier part 92 to the outside of the vacuum chamber 1 (a control part of the workpiece transfer mechanism 3). The wireless transmitting part 94 is connected to the sensor amplifier part 92 and the antenna 95, and can transmit the signal from the sensor amplifier part 92 via the antenna 95 by wireless.

The solar panel 96 exchanges light energy into electric power. The solar panel 96 is connected to the battery part 93 via the battery charger 97, and the battery part 93 is charged with the electric power generated in the solar panel 96 via the battery charger 97.

In this embodiment, a charging part according to the present invention is constructed by the solar panel 96 and the battery charger 97.

The housing 98 shown in FIGS. 4 and 5 covers the sensor amplifier part 92, the battery part 93, the wireless transmitting part 94, the antenna 95, a the panel 96 and the battery charger 97. The housing 98 is hollow and substantially rectangular. The housing 98 is fixed to the rear end of the basal end part 71 of the first end effector 70 (see FIGS. 3 and 4).

As shown in FIG. 5(*a*), two feedthrough units 98*a* are provided in a part of the outer wall of the housing 98. The sensor part 91 is connected to the sensor amplifier part 92 by the wire 91*a* via the feedthrough units 98*a*, and the wireless transmitting part 94 is connected to the antenna 95 via the feedthrough units 98*a*. By using the feedthrough units 98*a* as this way, predetermined apparatuses can be connected while the inner space of the housing 98 is disconnected from the space inside the vacuum chamber 1 (vacuum space).

A translucent part 98*b* is provided in a part of the outer wall of the housing 98 (in more detail, a part opposite to the solar panel 96). The translucent part 98*b* is formed by material through which light can pass, such as glass. Via the translucent part 98*b*, light from the light source 4 arranged outside the housing 98 is introduced to the inside of the housing 98 and irradiated to the solar panel 96.

As shown in FIG. 5(*b*), the light source 4 is arranged in the outer wall of the vacuum chamber 1. The light source 4 is arranged oppositely to the housing 98 (in more detail, the translucent part 98*b* of the housing 98) when the workpiece transfer mechanism 3 is at the work origin posture. Accordingly, when the workpiece transfer mechanism 3 is at the work origin posture, light from the light source 4 is irradiated to the solar panel 96 via the translucent part 98*b*, and the battery part 93 can be charged with electric power generated by the solar panel 96. Namely, electric power can be supplied from the outside of the vacuum chamber 1 to the battery part 93 with the contactless method. It is necessary to operate the light source 4 only in the case in which the workpiece transfer mechanism 3 is at the work origin posture, whereby power consumption can be reduced.

In the workpiece detection mechanism 90 constructed as mentioned above, the sensor part 91 can detect whether the workpiece 5 exists at a predetermined position on the first end effector 70 or not and whether the workpiece 5 drops out during conveyance or not, and the detection signal can always be transmitted by wireless to the outside via the wireless transmitting part 94. When the detection signal is received outside the vacuum chamber 1 and the workpiece 5 does not exist at the predetermined position or drops out, the operation of the workpiece transfer mechanism 3 can be stopped immediately.

The workpiece detection mechanism 90 is operated by electric power of the battery part 93, and the electric power is supplied by the solar panel 96 and the battery charger 97 when the workpiece transfer mechanism 3 is at the work origin posture.

Accordingly, all the members constituting the workpiece detection mechanism 90 are provided in the first end effector 70, whose movement amount and momentum are the largest in the workpiece transfer mechanism 3, and are connected directly wiredly with a wire or the like only to the first end effector 70 and communicated with the control part of the workpiece transfer mechanism 3 only with wireless communication. Therefore, regardless of the movement of the first end effector 70, the wire of the workpiece detection mechanism 90 is not damaged by being pulled or the like. Furthermore, for preventing the damage, it is not necessary to restrict the movement of the first end effector 70 (for example, rotation range of the first link arm parts 50 and the second link arm parts 60, turning range of the turning shaft 30, the vertical movement range of the elevation shaft 20 and the like).

As mentioned above, the workpiece detection mechanism 90 according to this embodiment detecting the workpiece 5 conveyed by the workpiece transfer mechanism 3 in the vacuum chamber 1 (vacuum room) has the sensor part 91 detecting the workpiece 5, the sensor amplifier part 92 connected to the sensor part 91 and processing the signal from the sensor part 91, the battery part 93 supplying electric power to the sensor amplifier part 92, and the wireless transmitting part 94 transmitting by wireless the signal from the sensor amplifier part 92 to the outside of the vacuum chamber 1. The sensor part 91, the sensor amplifier part 92, the battery part 93 and the wireless transmitting part 94 are provided in the one first end effector 70 provided in the workpiece transfer mechanism 3 and are not connected directly to any member other than the first end effector 70.

According to the construction, the workpiece detection mechanism 90 is not provided over the first end effector 70 and another member (for example, the second link arm parts 60), whereby the wire or the like of the workpiece detection mechanism 90 is not damaged by the movement of the first end effector 70, and the movement of the first end effector 70 is not restricted.

The workpiece detection mechanism 90 is not provided over the plurality of the members (for example, the first end effector 70 and the second link arm parts 60). Accordingly, for example, it is not necessary to open holes in the members and wires provided therein are pulled out so as to connect the wires, whereby airtightness of the members is not spoiled.

Since the workpiece detection mechanism 90 is provided in the first end effector 70, the workpiece 5 conveyed by the first end effector 70 can be detected at any position in the conveyance route of the workpiece 5 by the workpiece transfer mechanism 3. Therefore, when unusual situation such as drop out of the workpiece 5 occurs, countermeasures such as stopping of the workpiece transfer mechanism 3 can be performed immediately.

The workpiece detection mechanism 90 has the charging part (the solar panel 96 and the battery charger 97) which exchanges energy supplied from the outside of the vacuum chamber 1 with the contactless method into electric power and charges the battery part 93. The charging part is provided in the one first end effector 70 and not connected directly to any member other than the first end effector 70, energy is supplied from the outside of the vacuum chamber 1 to the charging part with the contactless method, and electric power is generated and the charging is performed.

According to the construction, the battery part 93 can be charged without being connected directly to any apparatus outside the vacuum chamber 1. Therefore, it is not necessary to connect any wire directly from the outside of the vacuum chamber 1 to the workpiece detection mechanism 90 for the charging or supply of electric power, whereby the movement of the first end effector 70 is not restricted.

In the embodiment mentioned above (see FIG. 5), the workpiece detection mechanism 90 has the solar panel 96 and the battery charger 97 as the charging part (see FIG. 5(a)). However, the present invention is not limited thereto.

For example, as shown in FIG. 6(a), an induction coil 196 may alternatively be provided instead of the solar panel 96. In this case, the housing 98 (in more detail, the induction coil 196) is moved closely to a magnetic field generator 104 arranged outside the housing 98 so as to generate electric power by electromagnetic induction, and the battery part 93 is charged with the generated electric power.

As shown in FIG. 6(b), the solar panel 96 and the battery charger 97 as the charging part may alternatively not be provided. In this case, the battery part 93 is a primary battery instead of the secondary battery. When electric power is used up, residual amount alarm is notified and the battery part 93 is replaced with new one (charged one), whereby the workpiece detection mechanism 90 can be used continuously.

In the embodiments mentioned above (see FIGS. 5 and 6), the sensor amplifier part 92, the battery part 93 and the like are simply covered by the housing 98. However, the present invention is not limited thereto, and the housing 98 may alternatively be thermally insulated with the space inside the vacuum chamber 1.

For example, as shown in FIG. 7(a), the outside of the housing 98 may alternatively be covered by a reflector 6. Accordingly, the temperature inside of the housing 98 can be prevented from rising by radiant heat in the vacuum chamber 1, whereby failure of the workpiece detection mechanism 90 caused by the rising of temperature can be prevented.

As shown in FIG. 7(b), a heat insulating member 7 may alternatively be provided in the outside (or the outer peripheral surface) of the housing 98 so as to prevent the temperature inside of the housing 98 from rising.

As shown in FIG. 7(c), it may alternatively be constructed that the heat insulating member 7 is provided in the outside (or the outer peripheral surface) of the housing 98 and these are covered by the reflector 6. Accordingly, the temperature inside of the housing 98 can be prevented from rising more efficiently.

As mentioned above, in the workpiece detection mechanism 90 according to this embodiment, the parts of the workpiece detection mechanism 90 other than the sensor part 91 is covered by the one housing 98, and the one housing 98 is thermally insulated with the space inside the vacuum chamber 1.

According to the construction, the temperature inside of the housing 98 can be prevented from rising by radiant heat in the vacuum chamber 1, whereby failure of the parts (for example, the sensor amplifier part 92 and the battery part 93) is prevented.

Figure 8:
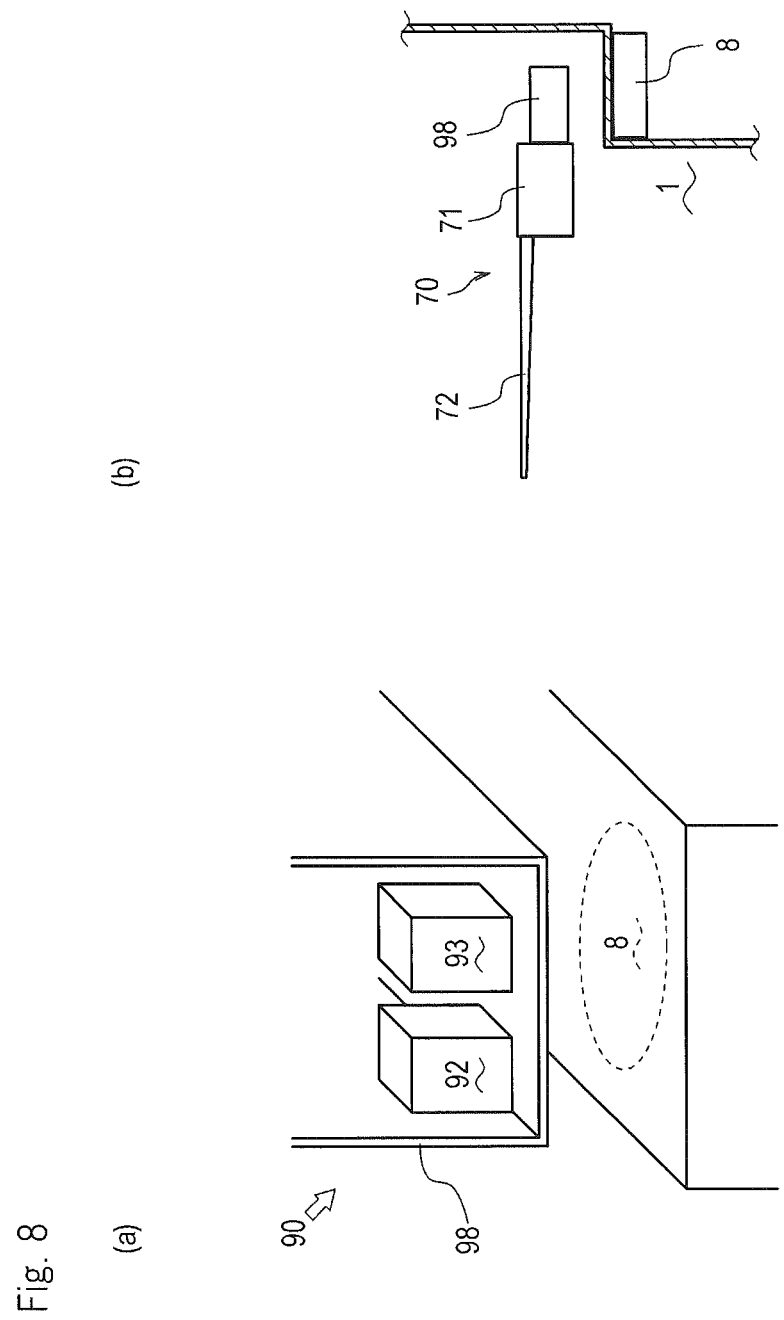
FIG. 8(a) is a perspective view of positional relation between the housing and a cooling device. (b) is a schematic sectional side view of the positional relation between the housing and the cooling device.

As shown in FIG. 8, a cooling device 8 may be used for preventing the temperature inside of the housing 98 from rising.

In this case, a heat absorption plate or the like can be used as the cooling device 8. The cooling device 8 is arranged at a position close to the housing 98 when the workpiece transfer mechanism 3 is at the work origin posture. When the workpiece transfer mechanism 3 is at the work origin posture, the cooling device 8 is able to absorb heat from the housing 98 so as to prevent the temperature of the housing 98 from rising.

As the cooling device 8, instead of the heat absorption plate, a member of a color with high heat absorbability (such as black) may alternatively be used.

In the embodiment mentioned above, the housing 98 is fixed to the rear end of the basal end part 71 of the first end effector 70 (see FIG. 3). However, the present invention is not limited thereto. For example, the housing 98 may alternatively be fixed to the side surface (side end) of the basal end part 71 of the first end effector 70 as shown in FIG. 9(a) or fixed to the inner surface of the basal end part 71 of the first end effector 70 as shown in FIG. 9(b). The housing 98 may alternatively be fixed to the upper surface of the basal end part 71 of the first end effector 70 (not shown in drawings).

As mentioned above, in the workpiece detection mechanism 90 according to this embodiment, the one housing 98 is arranged in the basal end part 71 of the first end effector 70.

According to the construction, the members constituting the workpiece detection mechanism 90 (the members covered by the one housing 98) is arranged at a position at which the members touch hardly to the workpiece 5, whereby the members are prevented from being damaged.

In the embodiment mentioned above, the first link arm parts 50 and the second link arm parts 60 of the workpiece transfer mechanism 3 can be rotated only within the predetermined range. However, the workpiece transfer mechanism according to the present invention is applicable besides. As an example, an explanation will be given easily on a workpiece transfer mechanism 203.

Figure 10:
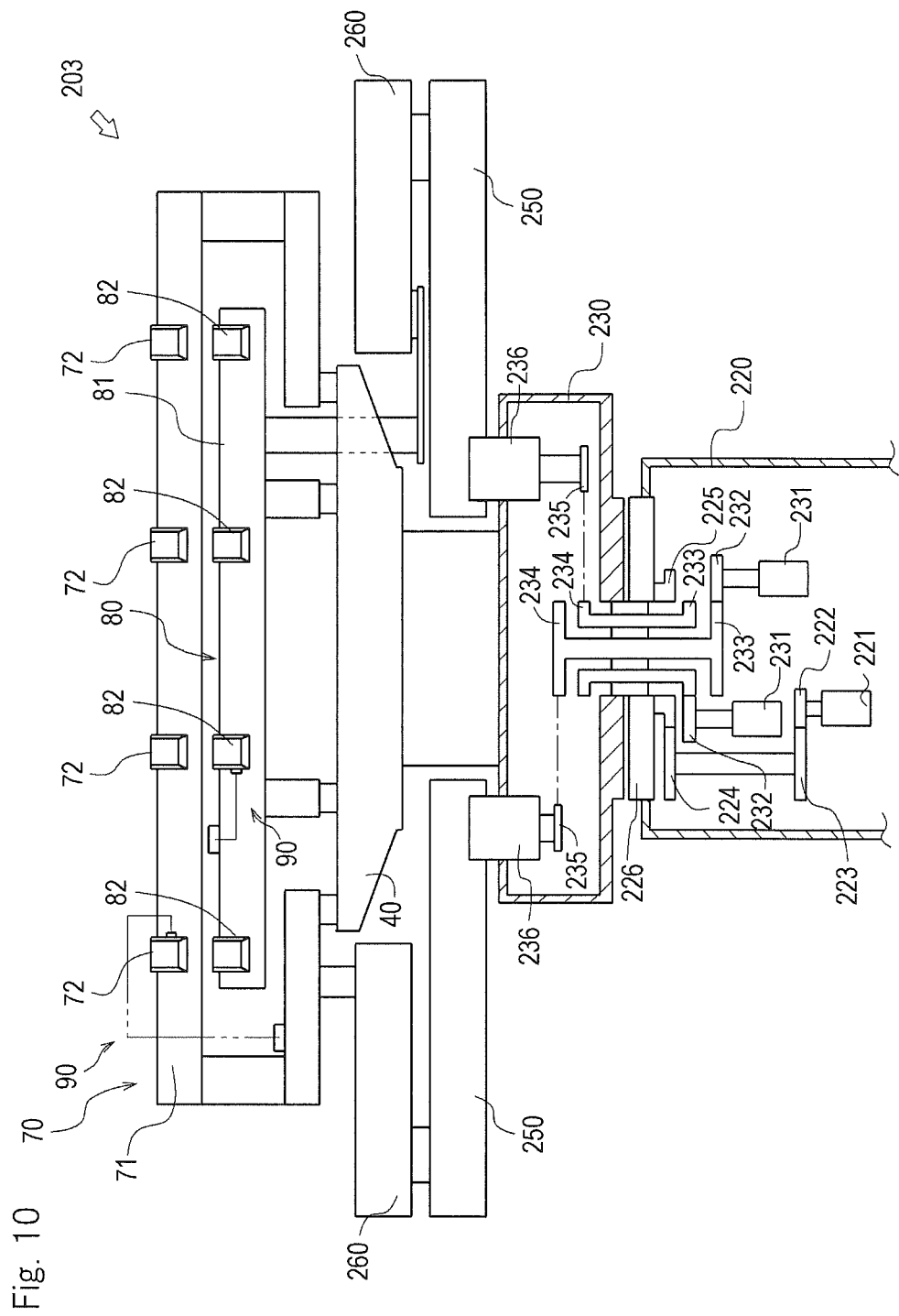
FIG. 10 A schematic sectional side view of another embodiment of the workpiece transfer mechanism.

The workpiece transfer mechanism 203 shown in FIG. 10 mainly has an elevation shaft 220, a turning shaft 230, a guide part 40, two first link arm parts 250, two second link arm parts 260, a first end effector 70, a second end effector 80 and the workpiece detection mechanism 90.

The elevation shaft 220 is formed so as to be a substantially hollow cylinder and is movable vertically by vertical moving mechanism (not shown in drawings). Inside the elevation shaft 220, a turning motor 221 and a turning reduction gear 226 are arranged so as to make the later-discussed turning shaft 230 turn.

The turning shaft 230 is formed so as to be a substantially hollow box and is rotatable (turnable) relatively to the elevation shaft 220. The turning shaft 230 is rotatively driven by driving power of the turning motor 221 transmitted via the turning reduction gear 226 and pulleys 225, 224, 223 and 222. The inside and the lower portion of the turning shaft 230, two sliding motors 231 are arranged so as to make the later-discussed first end effector 70 and second end effector 80 slide. The range (angle) within which the turning shaft 230 is rotatable relatively to the elevation shaft 220 is not limited, and the turning shaft 230 can be rotated infinitely along one direction.

The guide part 40 shown in FIG. 10 guides the later-discussed first end effector 70 and second end effector 80. The guide part 40 is supported by an upper end of the turning shaft 230. The lengthwise direction of the guide part 40 is arranged along the longitudinal direction. A rail is formed in the guide part 40 along the lengthwise direction thereof so as to guide the first end effector 70 and the second end effector 80.

The first link arm parts 250 shown in FIG. 10 transmit the driving power from the sliding motors 231 to the first end effector 70 and the second end effector 80. One of ends of each of the first link arm parts 250 is connected to the turning shaft 230 via a turning reduction gear 236 so as to be rotatable (turnable) and is connected to corresponding one of the sliding motors 231 via the turning reduction gear 236 and pulleys 235, 234, 233 and 232.

The second link arm parts 260 transmit the driving power from the sliding motors 231 to the first end effector 70 and the second end effector 80. One of ends of each of the second link arm parts 260 is rotatably connected to the other end of corresponding one of the first link arm parts 250.

The first end effector 70 conveys the workpiece 5 by mounting the workpiece 5 thereon or another method. The first end effector 70 mainly has a basal end part 71 and a mounting part 72.

The basal end part 71 is constructed by a plurality of plate members and the like and arranged so that the lengthwise direction thereof is along the lateral direction. The basal end part 71 is rotatably connected to the other end of one of the second link arm parts 260, and is supported by the guide part 40 so as to be able to slide along the rail of the guide part 40.

The mounting part 72 is constructed by four slender rod-like members, and is extendingly provided forward from the front end of the basal end part 71 while the lengthwise direction of the mounting part 72 is arranged along the longitudinal direction.

The second end effector 80 conveys the workpiece 5 by mounting the workpiece 5 thereon or another method. The second end effector 80 mainly has a basal end part 81 and a mounting part 82.

The basal end part 81 is constructed by a plate member and the like and arranged so that the lengthwise direction thereof is along the lateral direction. The basal end part 81 is rotatably connected to the other end of the other second link arm parts 260, and is supported by the guide part 40 so as to be able to slide along the rail of the guide part 40.

The mounting part 82 is constructed by four long and slender cylindrical members, and is extendingly provided forward from the front end of the basal end part 81 while the lengthwise direction of the mounting part 82 is arranged along the longitudinal direction.

In the workpiece transfer mechanism 203 constructed as mentioned above, the elevation shaft 220 is moved vertically by the vertical moving mechanism (not shown in drawings), the turning shaft 230 is turned by driving power of the turning motor 221, and the first link arm parts 250 are driven by driving power of the sliding motors 231. In the workpiece transfer mechanism 203, the range (angle) within which the turning shaft 230 is rotatable is not limited, and the turning shaft 230 can be rotated infinitely along one direction.

Accordingly, in the workpiece transfer mechanism 203 having the mechanism rotatable infinitely along one direction, the workpiece detection mechanism 90 is provided in the first end effector 70 and the second end effector 80 and is not connected to any member other than the first end effector 70 and the second end effector 80, whereby the wire or the like of the workpiece detection mechanism 90 is not damaged by the movement of the first end effector 70 and the second end effector 80.

Instead of the construction in which the sensor part 91 has the floodlighting part and the light receiving part, the floodlighting part and the light receiving part may alternatively be provided separately. As the sensor part 91, not only a light sensor but also various sensors such as a contact type sensor may be used.

The housing 98 is not limited to rectangular and may be shaped variously.

Each of the workpiece transfer mechanism 3 and the workpiece transfer mechanism 203 is an example and the workpiece detection mechanism 90 can be used for various kinds of workpiece transfer mechanism.

DESCRIPTION OF NOTATIONS

1 Vacuum Room
3 Workpiece Transfer Mechanism

5 Workpiece
70 First End Effector
80 Second End Effector
90 Workpiece Detection Mechanism
91 Sensor Part
92 Sensor Amplifier Part
93 Battery Part
94 Wireless Transmitting Part
96 Solar Panel
97 Battery Charger
98 Housing

The invention claimed is:

1. A workpiece detection mechanism detecting a workpiece conveyed by a workpiece transfer mechanism in an inside of a vacuum chamber, comprising:
    a sensor part detecting the workpiece;
    a sensor amplifier part connected to the sensor part and processing a signal from the sensor part;
    a battery part supplying electric power to the sensor amplifier part; and
    a wireless transmitting part transmitting by wireless the signal from the sensor amplifier part to an outside of the vacuum chamber, wherein
    the sensor part, the sensor amplifier part, the battery part and the wireless transmitting part are provided in one end effector provided in the workpiece transfer mechanism and are not connected directly to any member other than the end effector.

2. The workpiece detection mechanism according to claim 1, further comprising
    a charging part converting energy supplied from the outside of the vacuum chamber with a contactless method into electric power and charges the battery part, wherein
    the charging part is provided in the one end effector and not connected directly to any member other than the end effector and energy is supplied from the outside of the vacuum chamber to the charging part by the contactless method so that electric power is generated and used for charging.

3. The workpiece detection mechanism according to claim 1 or 2, wherein
    the parts other than the sensor part in the workpiece detection mechanism are covered by one housing, and
    the one housing is thermally insulated with an inner space of the vacuum chamber.

4. The workpiece detection mechanism according to claim 3, wherein
    the one housing is arranged in an basal end part of the end effector.

* * * * *